US011152562B2

(12) United States Patent
Zemen et al.

(10) Patent No.: US 11,152,562 B2
(45) Date of Patent: Oct. 19, 2021

(54) NON-VOLATILE MEMORY

(71) Applicant: IP2IPO Innovations Limited, London (GB)

(72) Inventors: Jan Zemen, Celakovice (CZ); Andrei Paul Mihai, London (GB); Bin Zou, London (GB); David Boldrin, London (GB); Evgeniy Donchev, London (GB)

(73) Assignee: IP2IPO Innovations Limited, London (GB)

( * ) Notice: Subject to any disclaimer, the term of this patent is extended or adjusted under 35 U.S.C. 154(b) by 0 days.

(21) Appl. No.: 16/470,039

(22) PCT Filed: Dec. 6, 2017

(86) PCT No.: PCT/GB2017/053674
§ 371 (c)(1),
(2) Date: Jun. 14, 2019

(87) PCT Pub. No.: WO2018/109441
PCT Pub. Date: Jun. 21, 2018

(65) Prior Publication Data
US 2019/0363247 A1  Nov. 28, 2019

(30) Foreign Application Priority Data

Dec. 16, 2016  (GB) ..................... 1621485

(51) Int. Cl.
*G11C 11/00* (2006.01)
*H01L 43/10* (2006.01)
(Continued)

(52) U.S. Cl.
CPC .......... *H01L 43/10* (2013.01); *G11C 11/161* (2013.01); *G11C 11/1673* (2013.01);
(Continued)

(58) Field of Classification Search
CPC ....... H01L 43/10; H01L 27/20; H01L 27/222; G11C 11/1673; G11C 11/1675; G11C 11/22
See application file for complete search history.

(56) References Cited

U.S. PATENT DOCUMENTS 6,339,543 B1  1/2002  Shimada et al.
6,387,476 B1  5/2002  Iwasaki et al.
(Continued)

FOREIGN PATENT DOCUMENTS

CN    104900799        9/2015
CN    105720188 A      6/2016
(Continued)

OTHER PUBLICATIONS

Lukashev et al., "Spin Density in frustrated magnets under mechanical stress: Mn-based antiperovskites", Journal of Applied Physics 107, 09E115 (2010).
(Continued)

*Primary Examiner* — Toan K Le
(74) *Attorney, Agent, or Firm* — Smith Gambrell & Russell LLP

(57) ABSTRACT

A non-volatile memory cell comprising: a storage layer comprised of a ferromagnetic or ferroelectric material in which data is recordable as a direction of magnetic or electric polarisation; a piezomagnetic layer comprised of an antiperovskite piezomagnetic material selectively having a first type of effect on the storage layer and a second type of effect on the storage layer dependent upon the magnetic state and strain in the piezomagnetic layer; and a strain inducing layer for inducing a strain in the piezomagnetic layer thereby to switch from the first type of effect to the second type of effect.

30 Claims, 10 Drawing Sheets

(51) Int. Cl.
  *G11C 11/16* (2006.01)
  *G11C 11/22* (2006.01)
  *H01L 27/20* (2006.01)
  *H01L 27/22* (2006.01)
  *H01L 43/02* (2006.01)

(52) U.S. Cl.
  CPC .......... *G11C 11/1675* (2013.01); *G11C 11/22* (2013.01); *H01L 27/20* (2013.01); *H01L 27/222* (2013.01); *H01L 43/02* (2013.01)

(56) References Cited

U.S. PATENT DOCUMENTS

| | | | | |
|---|---|---|---|---|
| 6,809,516 | B1 * | 10/2004 | Li | G01R 15/20 324/244 |
| 2003/0103371 | A1 | 6/2003 | Kim et al. | |
| 2003/0197970 | A1 * | 10/2003 | Srinivasan | H01L 41/16 360/77.16 |
| 2006/0133137 | A1 | 6/2006 | Shin et al. | |
| 2009/0020745 | A1 | 1/2009 | Jeong et al. | |
| 2010/0259846 | A1 | 10/2010 | Hauet et al. | |
| 2011/0236704 | A1 | 9/2011 | Barbier et al. | |
| 2012/0243291 | A1 | 9/2012 | Gopalakrishnan | |
| 2012/0267735 | A1 | 10/2012 | Atulasimha et al. | |
| 2013/0250661 | A1 | 9/2013 | Sandhu et al. | |
| 2014/0113828 | A1 * | 4/2014 | Gilbert | H01L 39/225 505/100 |
| 2016/0314825 | A1 | 10/2016 | Sukegawa et al. | |
| 2018/0158496 | A1 | 6/2018 | Sugahara et al. | |

FOREIGN PATENT DOCUMENTS

| | | |
|---|---|---|
| TW | 201103125 | 1/2011 |
| WO | WO10039424 | 4/2010 |
| WO | WO11158208 | 12/2011 |
| WO | 2016048317 A1 | 3/2016 |

OTHER PUBLICATIONS

Gomonaj et al., "Magnetisation and Peizomagnetism of Noncollinear Antiferromagnet Mn3NiN", Phase Transitions vol. 18, pp. 93-101 (1989).
Combined Search and Examination Report Under Sections 17 and 18(3) issued by the Intellectual Property Office dated Sep. 8, 2017.
Written Opinion of the International Search Authority and International Search Report issued by the European Patent Office dated May 8, 2018.
Lukashev, R, et al., "Theory of the Piezomagnetic Effect in Mn-Based Antiperovskites," Physical Review B 78, 184414 (2008).
Search Report issued for the corresponding Singaporean patent application by the Singaporean Intellectual Property Office dated Jul. 24, 2020.
Lukashev P. et al, Theory of the piezomagnetic effect in Mn-based antiperovskites. Physical Review B, Nov. 14, 2008, vol. 78, No. 18, pp. 184414-1-5.
Kanai, S., et al., "Electric-field-induced magnetization switching in CoFeB/MgO magnetic tunnel junctions with high junction resistance" Appl. Phys. Lett. 108, 192406 (2016).
Lukashev, P., et al. "Large magnetoelectric effect in ferroelectric/ plezomagnetic heterostructures" Phys. Rev. B 84, 134420—Oct. 17, 2011.
"Tashiro, H., et al., "Preparation and Properties of Inverse Perovskite Mn3GaNThin Films and Heterostructures" Journal of the Korean Physical Society, vol. 63(3):299-301 Aug. 2013".
Yu, G., et al., "Switching of perpendicular magnetization by spin-orbit torques in the absence of external magnetic fields" NNanno vol. 9:548-554 Jul. 2014.
Lukashev, et al., "Theory of the Piezomagnetic Effect in Mn-based Antiperovskites," Physics Faculty Publications, vol. 78, Issue 18, Jan. 1, 2008; 6 pages.
The office action released by the Taiwan Patent Office for corresponding Taiwan application No. 106144085 dated Mar. 25, 2021; 18 pages.

* cited by examiner

Figure 8
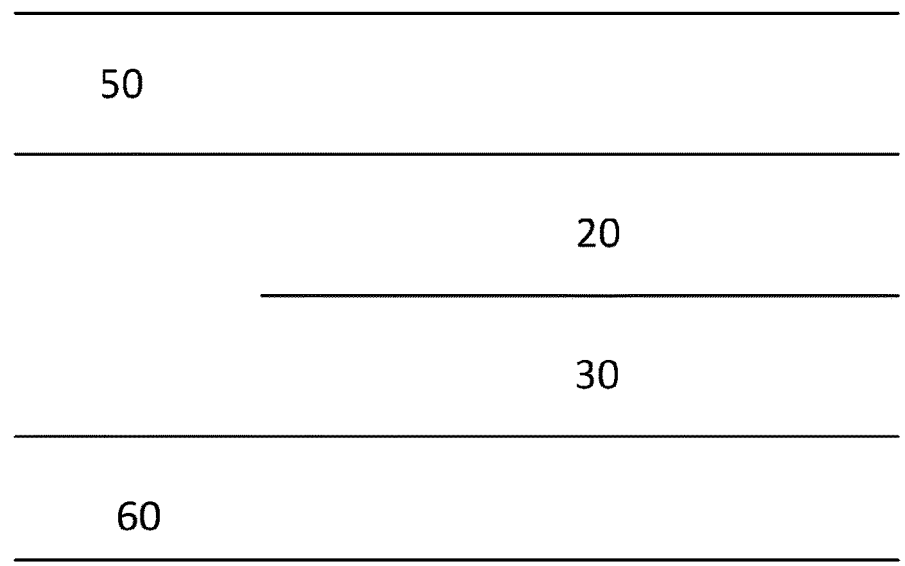
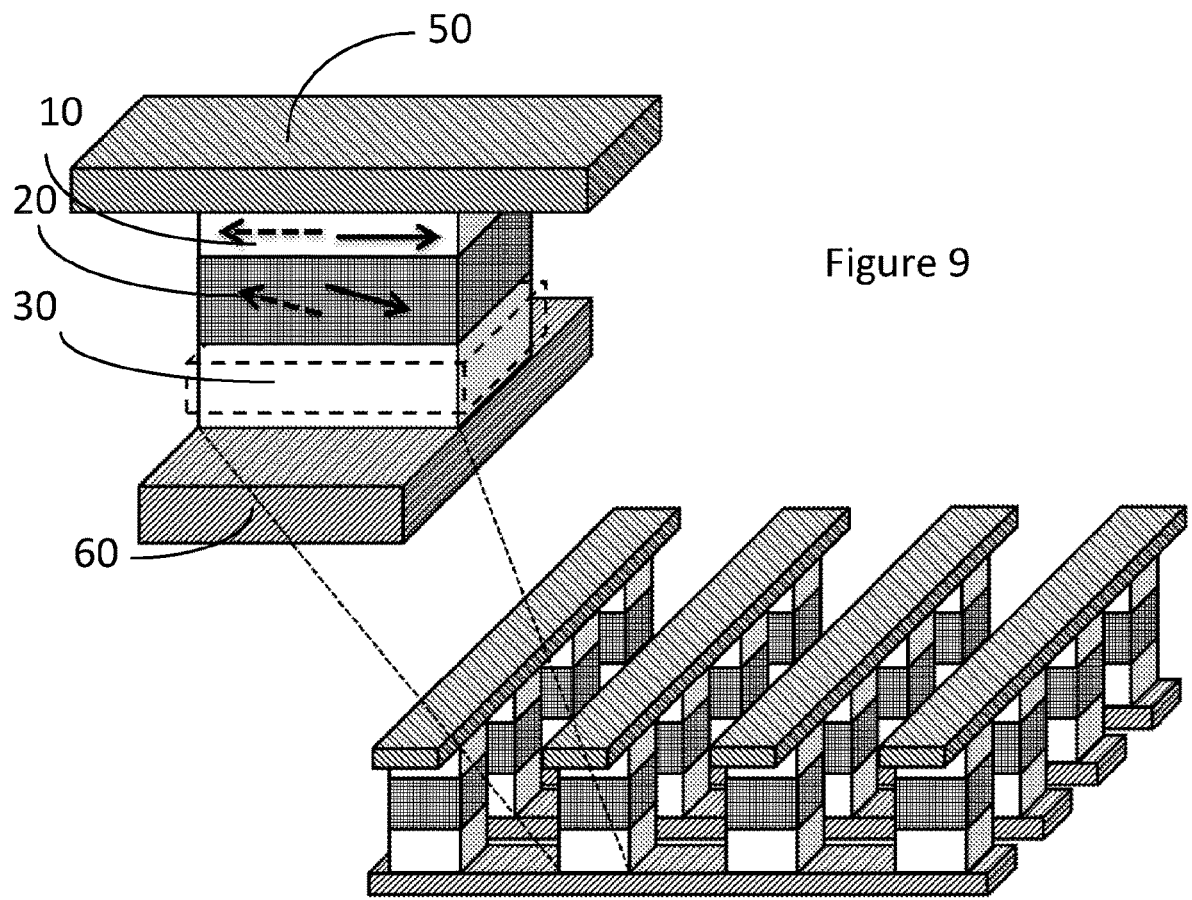
Figure 9

NON-VOLATILE MEMORY

The present invention relates to a non-volatile memory (NVM) cell and to a method of writing data to and reading data from a non-volatile memory cell.

The present invention aims to fill the gap between the high performance, volatile, expensive computer random access memory (RAM) and the low performance, low cost, non-volatile data storage devices such as hard disk drives (HDDs). Emerging NVM technologies attempting to fill this gap are referred to as storage class memory (SCM).

In terms of improving the performance of data storage, the main candidate is NAND-Flash, the dominant technology in solid state drives (SSDs), which is currently too expensive to replace HDDs and its low endurance, performance, and energy efficiency prevent its application as RAM. Improved HDD technology such as the Heat Assisted Magnetic Recording (HAMR) also suffers from low performance. Among non-volatile memory technologies under development the main contenders are spin-transfer torque RAM (STT-RAM, suffers from limited scalability, requires relatively high current densities to achieve switching between states), Ferroelectric RAM (FRAM, uses destructive readout and suffers from lower endurance), Phase-change memory (PCM, suffers from low endurance, energy efficiency and relies on expensive, toxic materials), Resistive RAM (RRAM, uses destructive readout and the passive memory arrays suffer from the sneak path problem) and multicell devices based on these principles.

Existing NVM cells suffer from one or more of the following disadvantages: they require a transistor for reading and/or writing data, they require more than two electrodes for reading and writing data, they are not stackable and so cannot be formed in three-dimensional arrays, they have low packing density in two dimensions.

SUMMARY OF INVENTION

The present invention provides a non-volatile memory cell comprising: a storage layer comprised of a ferromagnetic material in which data is recordable as a direction of magnetisation; a piezomagnetic layer comprised of an antiperovskite piezomagnetic material selectively having a first type of effect on the storage layer and a second type of effect on the storage layer dependent upon the strain in the piezomagnetic layer; a strain inducing layer for inducing a strain in the piezomagnetic layer thereby to switch from the first type of effect to the second type of effect.

Therefore, the present invention makes use of the changing properties of antiperovskite piezomagnetic materials with varying strain selectively to vary the strength of the interaction between the storage layer and the piezomagnetic layer. The two types of effect allow writing to the memory cell. The magnetisation in the storage layer affects a magnetic state in the piezomagnetic layer. The magnetic state in the piezomagnetic layer affects the elastic properties of the piezomagnetic layer due to its strong magneto-elastic coupling. The piezomagnetic layer forms the top plate of a planar capacitor and measuring its capacity is used to read the magnetic state of the storage layer (the magneto-capacitance effect) using only two electrodes.

In an embodiment, the first type of effect is one where a net magnetisation of the piezomagnetic layer is strong enough to overcome the coercive field in the storage layer and for the magnetisation of the storage layer to align with the magnetisation of the piezomagnetic layer through dipolar coupling and the second type of effect is one where any magnetic field in the storage layer due to any magnetisation of the piezomagnetic layer is lower than the coercive field of the storage layer. Therefore, in the second type of effect the magnetisation of the storage layer does not change direction.

Therefore, in order to write information, voltage is applied to the piezoelectric layer which induces strain in the piezomagnetic layer to change its magnetisation. The change in magnetisation of the piezomagnetic layer is effective to change the direction of magnetisation of the storage layer due to dipolar coupling between the storage layer and the piezomagnetic layer. After the direction of magnetisation of the storage layer has been changed, the strain in the strain inducing (piezoelectric) layer is reduced to a small value (e.g. non-zero value) due to a small lattice mismatch between the piezomagnetic and strain-inducing layers or due to the ferroelectric polarisation of the strain-inducing layer, such that the magnetisation in the piezomagnetic layer reduces to a level such that any magnetic field in the storage layer is lower than the coercive field of the storage layer. Thereby the direction of magnetisation in the storage layer is unchanged once the strain is removed from the piezomagnetic layer (once the voltage is removed from the piezoelectric layer).

The advantage of this arrangement is that the same electrodes as used for writing to the storage layer can be used for reading the storage layer.

In an embodiment, the non-volatile memory cell comprises a non-magnetic layer between the storage layer and the piezomagnetic layer for preventing an exchange bias between the storage layer and the piezomagnetic layer. If an exchange bias existed between the storage layer and the piezomagnetic layer, when the strain applied to the piezomagnetic layer in order to write to the storage layer is removed, the direction of magnetisation in the storage layer would also be affected. Thereby including a non-magnetic layer between the storage layer and the piezomagnetic layer allows voltage to be removed from the NVM cell without losing the data stored in the storage layer.

In an embodiment, the antiperovskite piezomagnetic material has a Neel temperature (TN) greater than 350K at a strain of +/−30%, preferably +/−10%, most preferably +/−1%. This means that the antiperovskite piezomagnetic material will maintain its piezomagnetic properties at typical operating temperatures of the non-volatile memory cell and will not require, for example, any special cooling arrangements to ensure that the material does not rise above the Neel temperature and thereby become paramagnetic.

In an embodiment, the antiperovskite piezomagnetic material is a $Mn_3SnN$ based material (e.g. $Mn_{3-x}A_xSn_{1-y}B_yN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn). $Mn_3SnN$ is a material which has been found to have a Neel temperature of about 475 K as well as a large change in the induced magnetisation for a small change in strain and can thereby provide a high degree of reliability.

In an embodiment, the first type of effect is one in which the piezomagnetic layer is in the paramagnetic state and no exchange bias interaction between the storage layer and the piezomagnetic layer is present thereby allowing the direction of magnetisation of the storage layer to be changed by an external magnetic field and the second type of effect is an exchange bias interaction in which the piezomagnetic material is in the antiferromagnetic state so the direction of magnetisation of the storage layer is pinned by the piezomagnetic layer. An external magnetic field may be a switchable field applied globally to the whole array or locally to each bit or a constant perpendicular field driving a precessional magnetisation switching. In this embodiment, the newly discovered property of antiperovskite piezomagnetic materials that they exhibit a change in Neel temperature with strain is applied to the non-volatile memory cell. This allows, when the antiperovskite piezomagnetic material is paramagnetic, for the direction of magnetisation of the storage layer to be varied. The strain applied to the piezomagnetic material is then released returning the antiperovskite piezomagnetic material to an antiferromagnetic state when it pins the direction of magnetisation of the storage layer by exchange bias interaction. Thereby the direction of magnetisation in the storage layer is maintained even when no voltage is applied to the memory cell. Thus, such a memory cell is non-volatile, highly resilient to thermal fluctuations or external magnetic fields, and not power hungry.

In an embodiment, the piezomagnetic material has a Neel temperature which varies with strain and wherein the Neel temperature passes 293 K when the strain is varied from +30% to −30%, preferably +10% to −10%, most preferably +1% to −1%. This means that the device can be operated at typical ambient temperatures and no heating or cooling (such as in HAMR) is necessary in order for the NVM cell to operate correctly.

In an embodiment, the antiperovskite piezomagnetic material is $Mn_3GaN$ or $Mn_3NiN$ based e.g. $Mn_{3-x}A_xGa_{1-y}B_yN_{1-z}$ or $Mn_{3-x}A_xNi_{1-y}B_yN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn. A number of these materials have been found to exhibit a change in Neel temperature which varies with strain wherein the Neel temperature passes 293 K when the strain is varied from +1% to −1% and also exhibit a large change in Neel temperature in that strain range, thereby allowing easier control of the writing to the storage layer.

In an embodiment, the non-volatile memory cell comprises at least one additional electrode positioned adjacent the storage layer to induce a global or a local time dependent magnetic field for changing the direction of magnetisation of the storage layer. In an embodiment, the additional layer has constant magnetisation perpendicular to the magnetisation of the storage layer to induce precessional switching of the magnetisation of the storage layer when it becomes unpinned for one half of its precession period. This further mechanism is advantageous in the embodiment where the piezomagnetic material is made paramagnetic in a write procedure in order to unpin the storage layer. A single source of the applied magnetic field can be used to write data to multiple memory cells.

In a preferred embodiment, the strain inducing layer is a piezoelectric layer. This allows fast switching between different strain rates and excellent durability.

In an embodiment, the strain inducing layer is a perovskite material. This is advantageous as it is then possible to reduce any lattice mismatch between the strain inducing layer and the piezomagnetic layer. With a lower lattice mismatch both tensile and compressive strain can be induced in the piezomagnetic layer by the strain inducing layer and also any remaining strain in the piezomagnetic layer when the strain inducing layer is not activated (i.e. due to lattice mismatch) is reduced. This is advantageous because it improves the mechanical stability and durability of the memory cell.

In an embodiment, a lattice mismatch between the storage layer and the piezomagnetic layer and/or between the piezomagnetic layer and the strain inducing layer is less than 1%. This increases the durability of the device and in the case of low mismatch between the piezomagnetic layer and the inducing layer allows for both tensile and compressive strains to be induced in the piezomagnetic layer and thereby enables the write operations in the first type of embodiment. In the case that the non-volatile memory cell is part of a two or three-dimensional array of memory cells, small lattice mismatch enables large arrays to be built which would otherwise have unacceptable levels of strain in them.

In an embodiment, the storage layer is a perovskite layer. This is advantageous as the lattice mismatch between adjacent perovskite and antiperovskite layers allows low lattice mismatch between the layers with the accompanying advantages mentioned above.

In an embodiment, the non-volatile memory cell further comprises: a first electrode connected to the storage layer on a side opposite the piezomagnetic layer; and a second electrode connected to the strain inducing layer on a side opposite the piezomagnetic layer. The non-volatile memory can then be read and written to with only those two electrodes and without the need for a transistor at each cell of the array. Thus, the NVM cell is easily addressable. In a two-dimensional array, individual memory cells can be addressed with first and second electrodes shared with other cells of the array.

In an embodiment, there is provided a two- or three-dimensional array of memory cells comprising a plurality of non-volatile memory cells of the present invention. The memory cells of the present invention are ideally suited to being incorporated into a two or three-dimensional array because, particularly if built with low lattice mismatch between the layers, stresses are not built up as more memory cells are formed adjacent one another, both laterally and vertically. The size of each memory cell is small and the need for only two electrodes to perform both the read and write functions means that a high density memory can be achieved.

In an embodiment, there is provided a method of writing data to and reading data from a non-volatile memory cell comprising a storage layer and an antiperovskite piezomagnetic layer, the method comprising the steps of: inducing a polarisation in a first or second direction in the storage layer thereby to write data to the memory cell, polarisation of the storage layer in the first direction inducing a first magnetic state in the antiperovskite piezomagnetic layer and polarisation of the storage layer in the second direction inducing a second magnetic state in the antiperovskite piezomagnetic layer, and measuring a magneto-capacitance of the memory cell, the magneto-capacitance of the antiperovskite piezomagnetic layer being different in the first magnetic state than in the second magnetic state, thereby to read the data stored in the storage layer.

Thus, the information stored in the storage layer can be read using only two electrodes and without the need for a transistor and without overwriting the data stored in the memory. This is not achievable without the antiperovskite piezomagnetic layer as the capacity of a general ferroelectric capacitor is symmetric about the orientation of its electric polarisation. That is, the magneto-capacitance of the memory bit when measured in a fully compensated antiferromagnetic state or paramagnetic state of the antiperovskite piezomagnetic layer is the same irrespective of the direction of the ferroelectric polarisation. Conversely, for the canted antiferromagnetic state of the antiperovskite piezomagnetic layer, the magneto-capacitance varies with the orientation of the ferroelectric polarisation which affects the size of the magnetisation in the piezomagnetic layer. This is due to the frustrated magnetism of the antiperovskite piezomagnetic material underpinning the so called magneto-elastic coupling.

In an embodiment, the measuring comprises applying an alternating voltage across the storage layer and antiperovskite layer and determining a reactance and thereby the magneto-capacitance of the memory cell. In an embodiment, the measuring comprises determining a shift in resonance frequency of the memory cell.

In an embodiment, the storage layer is comprised of a ferromagnetic material and the polarisation is a magnetic polarisation i.e. a magnetisation.

In an embodiment, the inducing is performed by inducing a magnetisation in the antiperovskite piezomagnetic layer strong enough for the magnetic polarisation of the storage layer to align with the magnetisation of the antiperovskite piezomagnetic layer through dipolar coupling. Thus, the antiperovskite piezomagnetic material has two functions, both allowing the memory cell to be read and also being used in the write operation to induce the polarisation in the storage layer. This means that only two electrodes are needed to perform both the read and write functions and this without needing a transistor which uses power and uses up space.

In an embodiment, the non-volatile memory further comprises a strain inducing layer and inducing a magnetisation in the antiperovskite piezomagnetic layer is achieved by inducing a strain in the antiperovskite piezomagnetic layer using the strain inducing layer. Thus, by applying a potential difference across the strain inducing layer (which can be a piezoelectric material), a strain can be induced in the antiperovskite piezomagnetic layer. A strain in the antiperovskite piezomagnetic layer results in the generation of a magnetic spin polarisation in the antiperovskite piezomagnetic layer. The magnetic spin polarisation in the antiperovskite piezomagnetic layer thereby induces the magnetisation in the storage layer, for example by dipolar coupling.

In an embodiment, the inducing comprises inducing a magnetisation in the storage layer using a magnetisation electrode. Such a magnetisation electrode can be used to induce polarisation in the first or second direction in the storage layer of multiple non-volatile memory cells.

In an embodiment, the inducing further comprises inducing a strain in the antiperovskite piezomagnetic layer thereby to turn the antiperovskite piezomagnetic layer paramagnetic. In this embodiment, the antiperovskite piezomagnetic layer is used as a switch to allow writing on the storage layer or not to allow writing on the storage layer. Thereby in combination with the externally applied magnetic field, a system of reading and writing data to and from the non-volatile memory cell can be achieved.

In an embodiment, the non-volatile memory cell further comprises a strain inducing layer and the inducing strain is accomplished by the strain inducing layer. Thus, by applying a potential difference across the strain inducing layer (which can be a piezoelectric material), a strain can be induced in the antiperovskite piezomagnetic layer. This can be used to turn the antiperovskite piezomagnetic layer from an antiferromagnetic material into a paramagnetic material. This switch has fast response times and good longevity and can be used to pin and not to pin the polarisation in the storage layer.

In an embodiment, the storage layer is comprised of a ferroelectric material and the polarisation is an electric polarisation. In this embodiment, the non-volatile memory cell comprises a first electrode connected to the antiperovskite piezomagnetic layer on a side opposite the storage layer and a second electrode connected to the storage layer on a side opposite the antiperovskite piezomagnetic layer, and the inducing comprises applying a potential difference across the first and second electrodes, and the measuring comprises measuring the magneto-capacitance between the first and second electrodes. Such a device is extremely simple and compact and may be operated inside a transistorless array.

Embodiments of the invention will now be described by way of example only with reference to and as illustrated in the following drawings:

FIG. 8 is a cross sectional schematic diagram of a non-volatile electric memory cell according to a third embodiment;

FIG. 9 is a perspective schematic view of a two-dimensional magnetic memory array according to an embodiment;

The present invention makes use of the properties of Mn-based antiperovskites. These materials are known to exhibit the piezomagnetic effect. The piezomagnetic effect is a change in magnetisation due to the application of a stress which is manifested in the canted antiferromagnetic state of the Mn-based antiperovskites.

Figure 1A:
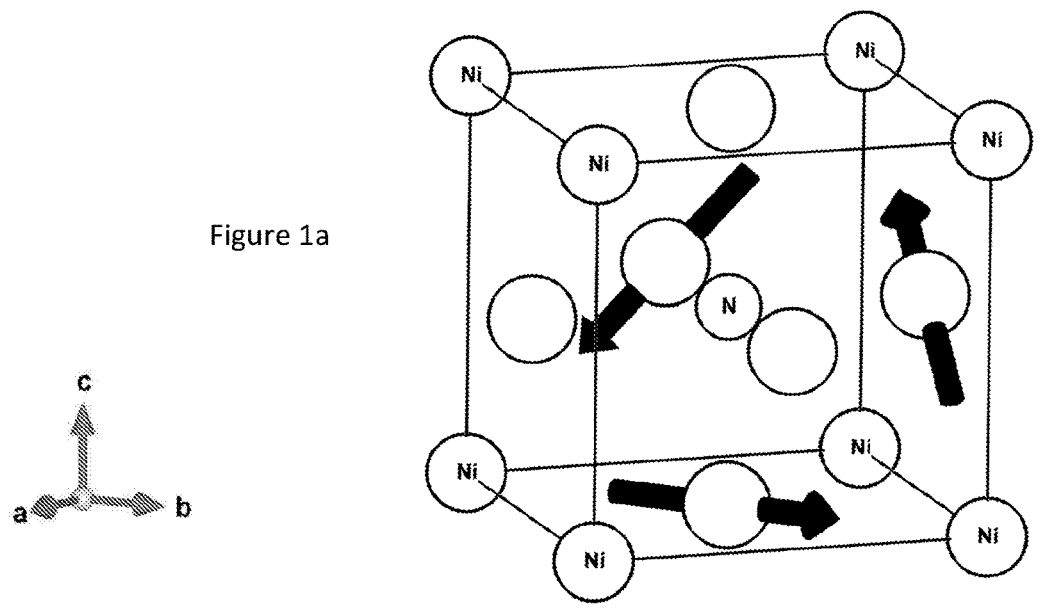
FIG. 1 is a schematic illustration of the lattice and magnetic structure of an antiperovskite piezomagnetic material.
Figure 1B:
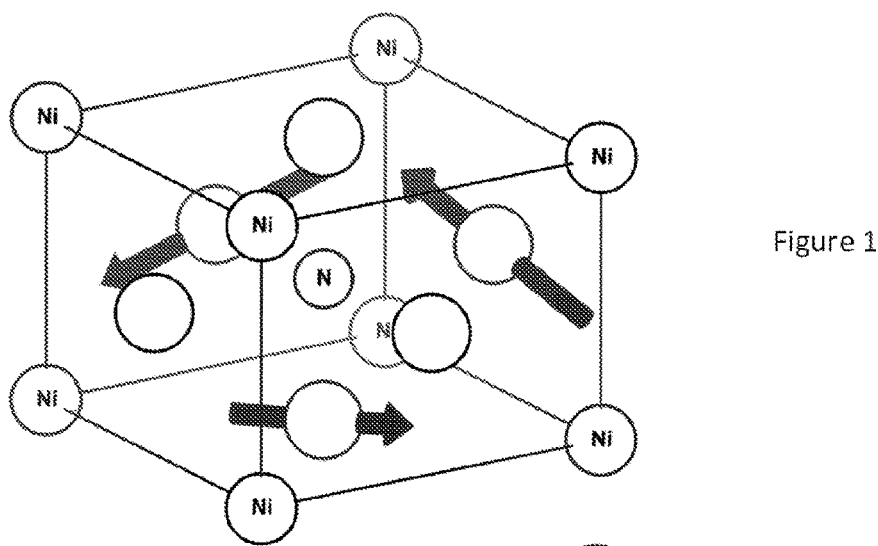
Figure 1C:
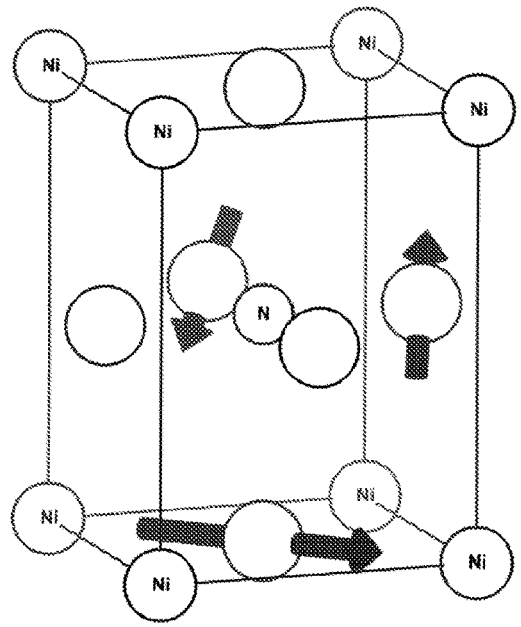

FIG. 1a illustrates the structure of a Mn-based antiperovskite in the unstrained state where there is no net magnetisation. FIG. 1b illustrates the case where a tensile strain is applied and there is an induced net magnetisation antiparallel to the [110] direction, and FIG. 1c illustrates the case where a compressive strain is applied which induces a net magnetisation parallel to the [110] direction. As is illustrated, on application of a tensile strain or a compressive strain a net magnetic spin polarisation (i.e. magnetisation) is induced. The direction of magnetic spin polarisation is opposite for tensile and compressive strains.

Figure 2:
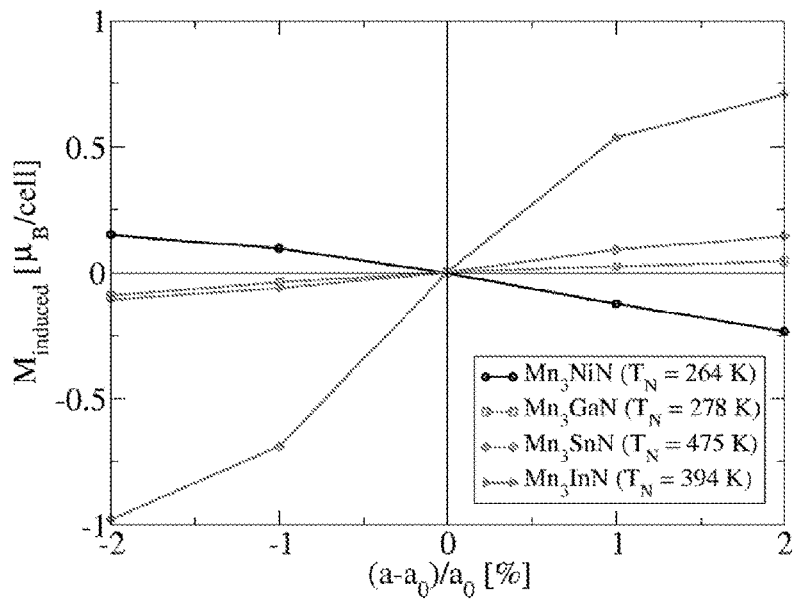
FIG. 2 is a graph of strain along the x-axis vs induced net magnetisation along the y axis for a selection of different antiperovskite piezomagnetic materials.

FIG. 2 is a graph along the x axis of percentage biaxial lattice strain and along the y axis of induced magnetisation. In FIG. 2 the variation in induced magnetisation is plotted for four different types of Mn-based antiperovskite material. As can be seen, the largest variation in magnetic field with strain occurs for $Mn_3SnN$, with the next most sensitive material being $Mn_3NiN$ followed by $Mn_3InN$ and then $Mn_3GaN$. Also illustrated is the Neel temperature at zero percent strain experimentally observed for bulk form of those materials. Above the Neel temperature, the materials become paramagnetic rather than antiferromagnetic and so the effect of change in magnetic spin polarisation with induced strain is not observed. The results in FIG. 2 are the results of simulations which have been confirmed experimentally for $Mn_3NiN$ (see FIG. 4 which shows Neel temperature and saturation magnetisation on the y axis as a function of the c axis strain on the x axis with saturation magnetisation taken from M-H loops at 100K).

Figure 3:
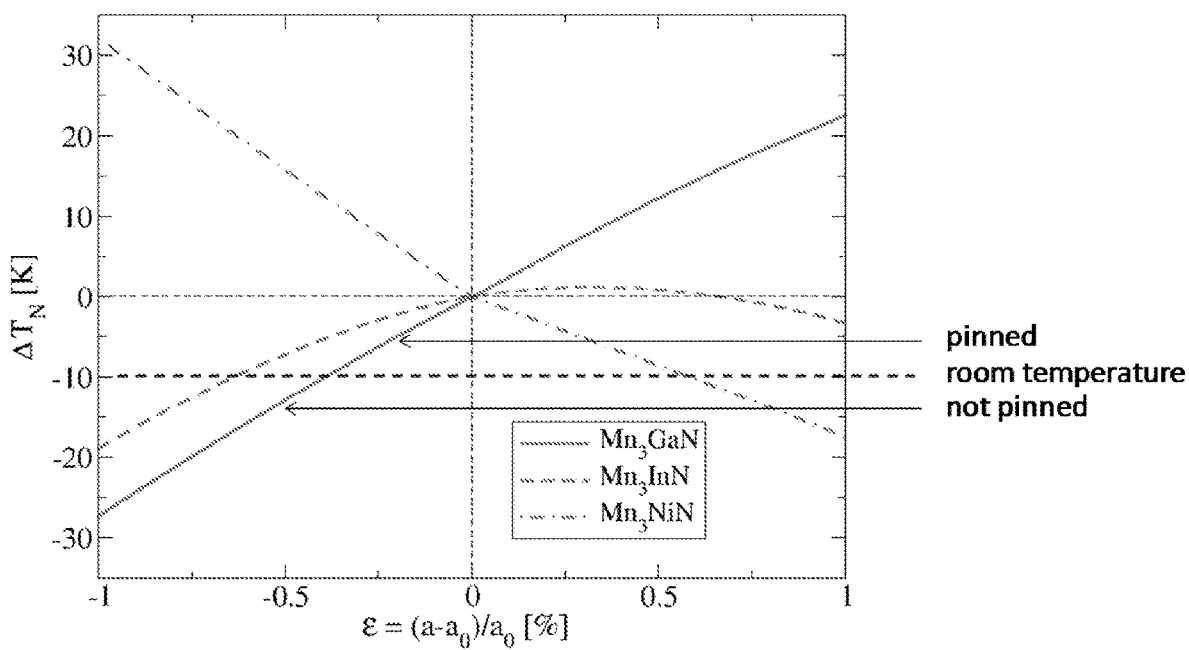
FIG. 3 is a graph of strain along the x-axis vs (Neel temperature—Neel temperature at zero strain) in Kelvin along the y axis for a selection of different antiperovskite piezomagnetic materials.
Figure 4:
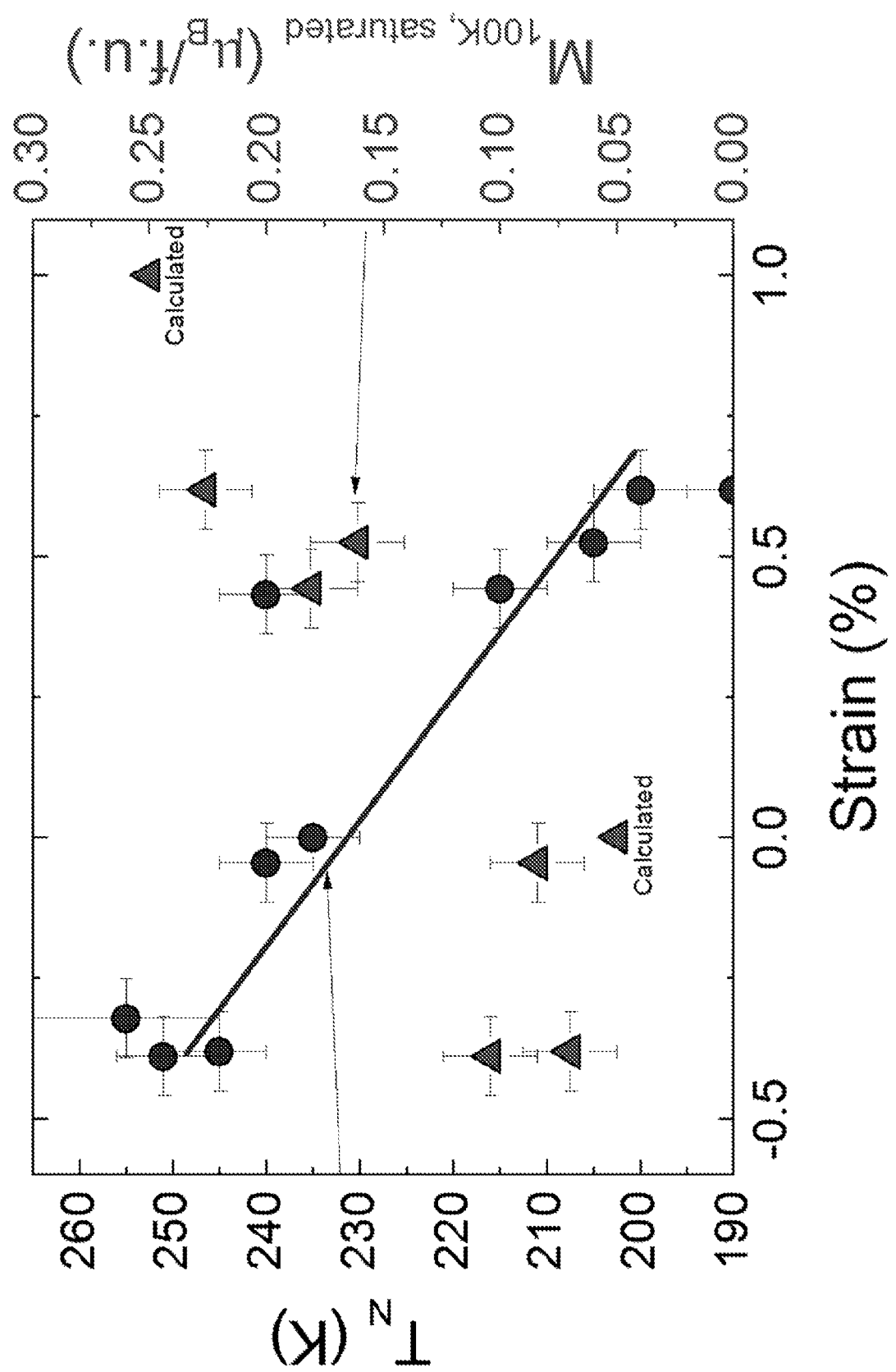
FIG. 4 is a graph of experimentally determined results for $Mn_3NiN$—Neel temperature and saturation magnetisation on the y axis as a function of the c axis strain on the x axis with saturation magnetisation taken from M-H loops at 100K.

The present inventors have discovered that the Neel temperature of Mn-based antiperovskites changes strongly with induced strain. The sensitivity of the Neel temperature to induced strain is illustrated in FIG. 3 where strain is plotted along the x axis and the deviation of the Neel temperature from its value at zero strain in Kelvin along the y axis for three different Mn-based antiperovskites. The results shown in FIG. 3 are based on theoretical calculations which are known to overestimate the Neel temperature (using the KKR-DLM mean field approximation (quantum mechanical code developed mainly by Professor J B Staunton at the University of Warwick)). Although the values of temperature in Kelvin are not representative of what is observed experimentally, the variations in Neel temperature are indicative of what is observed experimentally. As can be seen, both $Mn_3NiN$ and $Mn_3GaN$ exhibit a Neel temperature at around ambient temperature (at zero percent strain the Neel temperatures are 240K (as seen in FIG. 4) and 300K respectively, as determined experimentally). A change in strain in the Mn-based antiperovskite can be used to change the properties of the Mn-based antiperovskite from being piezomagnetic (below the Neel temperature) to being paramagnetic (above the Neel temperature). The results for the dependence of Neel temperature and induced magnetisation on strain in $Mn_3NiN$ have been confirmed experimentally (FIG. 4).

Figure 5:
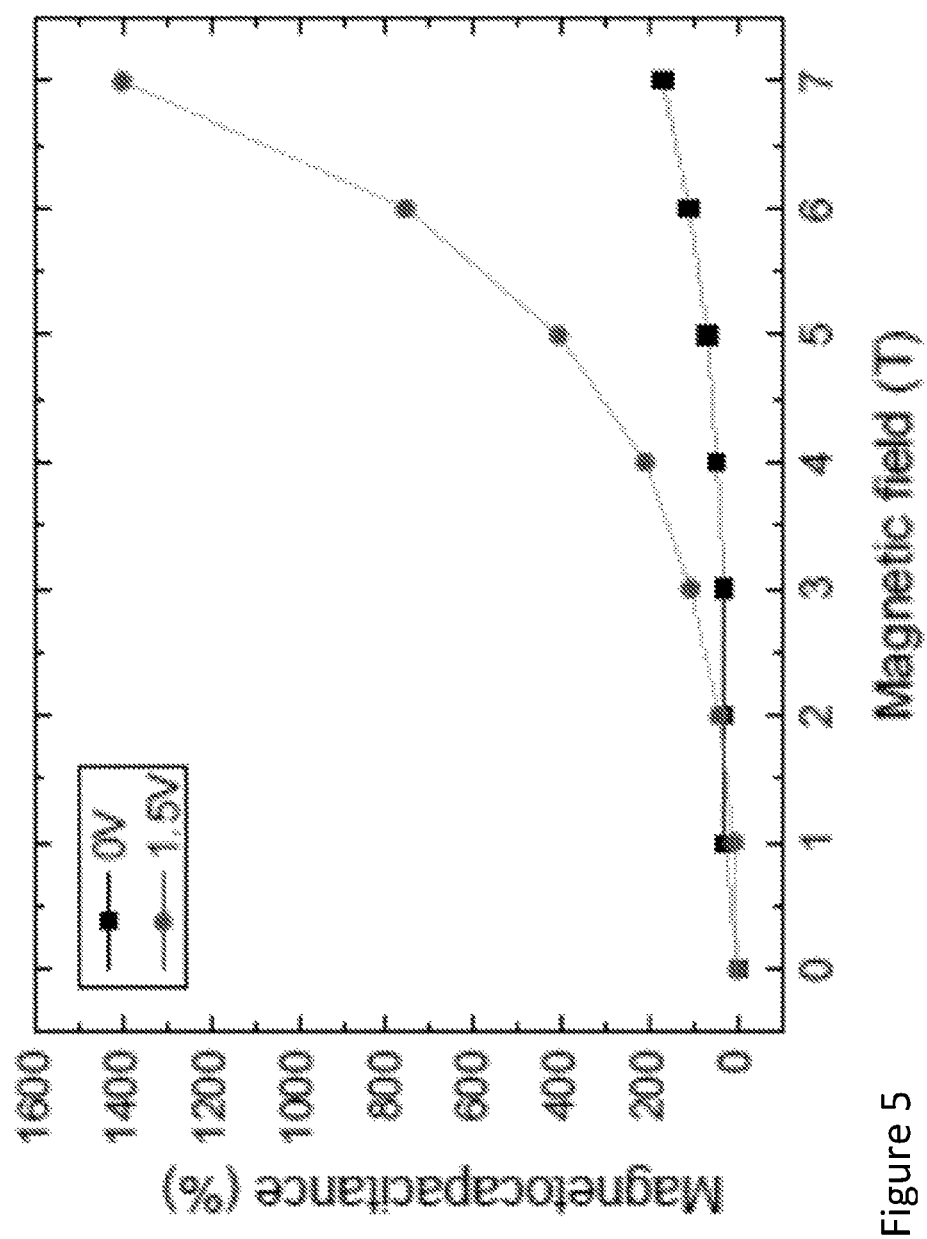
FIG. 5 is a graph of magneto-capacitance effect of $Mn_3GaN/Ba_{0.75}Sr_{0.25}TiO_3/SrRuO_3$ heterostructure on $(LaAlO_3)_{0.3}(Sr_2TaAlO_6)_{0.7}$ substrate at room temperature.

FIG. 5 shows the measured magneto-capacitance effect of $Mn_3GaN/Ba_{0.75}Sr_{0.25}TiO_3/SrRuO_3$ heterostructure on $(LaAlO_3)_{0.3}(Sr_2TaAlO_6)_{0.7}$ substrate at room temperature. The magneto-capacitance effect of more than 1400% under a magnetic field of 7T was obtained by applying a 1.5V DC bias between the bottom electrode ($SrRuO_3$) and a top electrode of Au. The change in the capacitance of $Ba_{0.75}Sr_{0.25}TiO_3$ results from the interfacial strain induced by the (inverse) piezomagnetic effect of the $Mn_3GaN$ layer under the magnetic field. It is noted that the magneto-capacitance effect is much less at a 0V DC bias compared to the magneto-capacitance effect at 1.5V DC bias. The large magneto-capacitance underpins the reading mechanism.

The present inventors have developed NVM cells on the basis of the understanding illustrated in FIGS. 1-5 of the properties of Mn-based antiperovskites.

Figure 6:
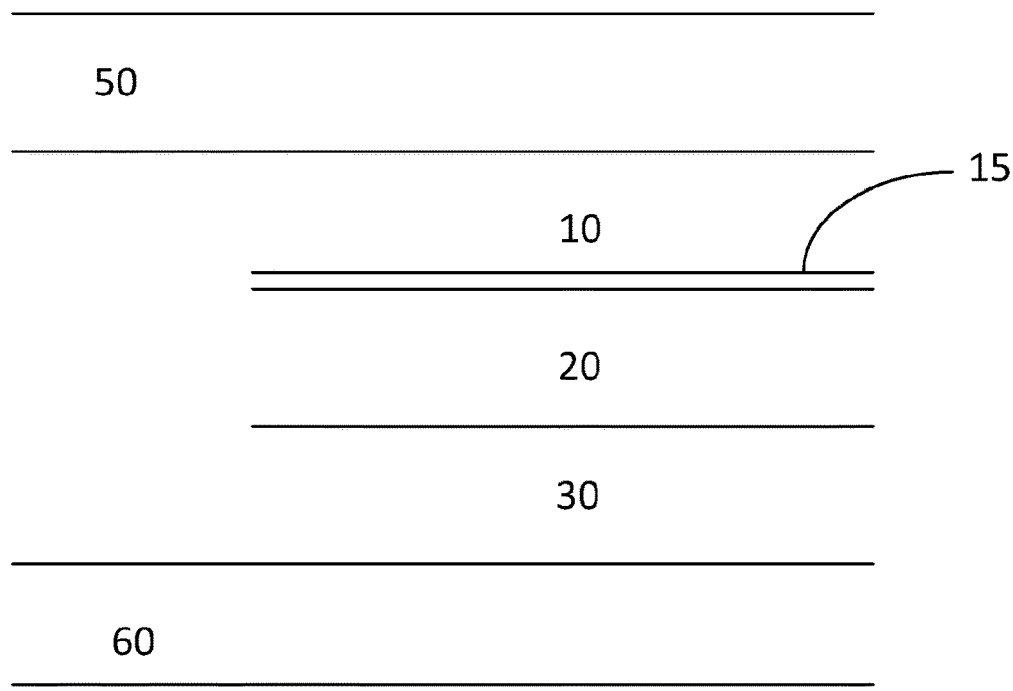
FIG. 6 is a cross sectional schematic diagram of a non-volatile magnetic memory cell according to a first embodiment.
Figure 7:
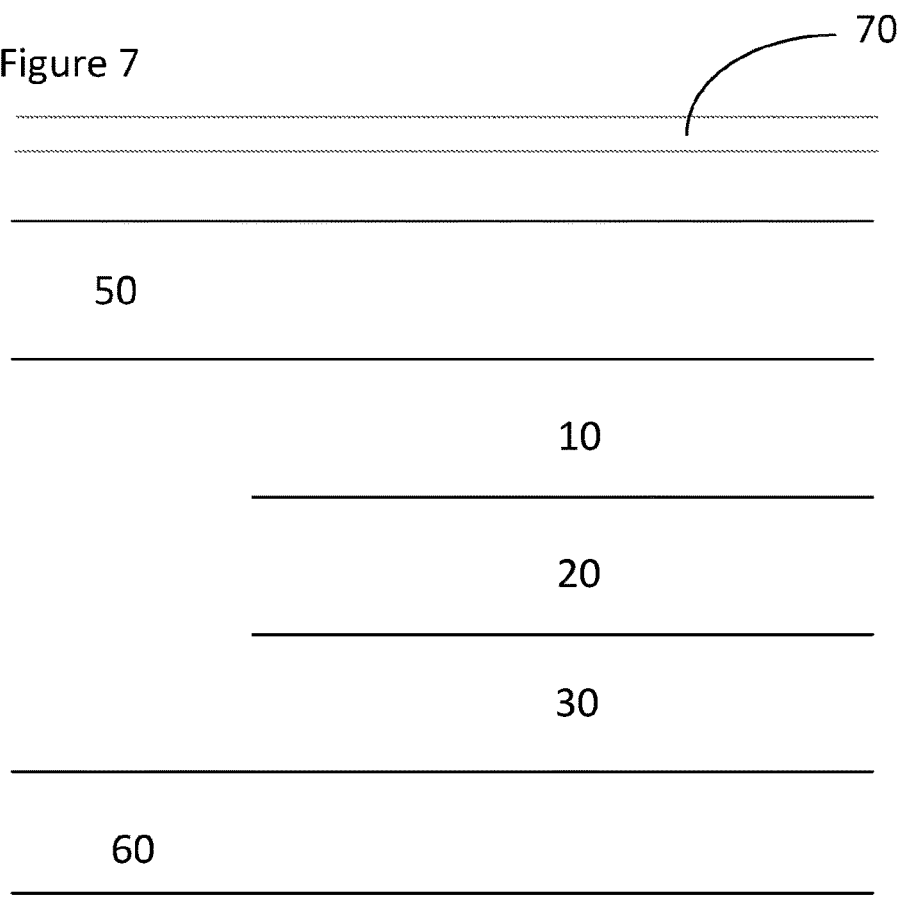
FIG. 7 is a cross sectional schematic diagram of a non-volatile magnetic memory cell according to a second embodiment.

In the first and second embodiments, a non-volatile memory cell utilises the properties of Mn-based antiperovskite piezomagnetic material illustrated in FIGS. 2-5. FIGS. 6 and 7 are cross-sectional schematic diagrams of non-volatile magnetic memory cells according to the first and second embodiments. The NVM cells comprise a storage layer 10 in which data is recordable. The storage layer 10 may be comprised of a ferromagnetic material. In this way, the data is recordable as a direction of magnetisation.

A piezomagnetic layer 20 is also provided. The piezomagnetic layer 20 is comprised of an antiperovskite piezomagnetic material, preferably Mn-based antiperovskite piezomagnetic material. Depending upon the strain in the piezomagnetic layer 20, the piezomagnetic layer 20 selectively has a first type of effect on the storage layer 10 (for example when under a compressive or tensile strain) and a second type of effect on the storage layer 10 (for example under low or no tensile or compressive strain).

A strain inducing layer 30 is provided for inducing a strain in the piezomagnetic layer 20 thereby to switch from the first type of effect to the second type of effect.

A first electrode 50 is provided on a side of the storage layer 10 opposite to the piezomagnetic layer 20. A second electrode 60 is provided on a side of the strain inducing layer 30 opposite to the piezomagnetic layer 20. The layers 20, 30, and 60 form a planar capacitor which exhibits the magneto-capacitance effect used to read out the stored information non-destructively by electrical means only (as described below).

By applying a voltage across the first and second electrodes 50, 60 a strain may be induced in the strain inducing layer 30. The strain induced by the potential difference across the first and second electrodes 50, 60 in the strain inducing layer 30 is transferred to the piezomagnetic layer 20. As illustrated in FIGS. 2-5, inducing a strain in the piezomagnetic layer 20 changes the property of the piezomagnetic layer 20 in terms of its magnetisation and/or in terms of its Neel temperature. The change in property of the piezomagnetic layer 20 has an effect (e.g. the first type of effect) on the storage layer 10 which is a different effect (e.g. the second type of effect) dependent upon the strain in the piezomagnetic layer 20.

In an embodiment, the piezomagnetic layer 20 is grown with the (001) orientation aligned perpendicular to the plane of the strain inducing layer 30 and the storage layer 10. This ensures good epitaxial growth, formation of the magnetic structure shown in FIG. 1, good mechanical stability, small lattice mismatch with the ferroelectric layer 30, and the maximum change in property (magnetisation, first embodiment or Neel temperature, second embodiment) for a given in-plane strain.

The strain inducing layer 30 may be a piezoelectric material, for example a ferroelectric material. In an embodiment, the strain inducing layer 30 has a perovskite or antiperovskite structure. For example, the strain inducing layer may be a $(Ba/Sr)TiO_3$ material. Having a perovskite structure may be advantageous because a well-defined interface and strong elastic coupling between the strain inducing layer 30 and piezomagnetic layer 20 is thereby achievable. A clean crystalline interface results in long life of the non-volatile memory cell and a large transfer of the strain induced in the strain inducing layer 30 being transferred to the piezomagnetic layer 20. Particularly in the case of the first embodiment, a low lattice mismatch between the strain inducing layer 30 and piezomagnetic layer 20 is desirable. This is because when no potential difference is applied between the first and second electrodes 50, 60, it is desirable that very little or no strain exists in the piezomagnetic layer 20. When no potential difference is applied, there is zero magnetisation (or a small magnetisation induced by the spontaneous electric polarisation of the adjacent ferroelectric strain-inducing layer or residual strain resulted from lattice mismatch between the strain inducing layer 30 and piezomagnetic layer 20) of the piezomagnetic layer 20 and it is desirable to have as low a magnetisation in the piezomagnetic layer 20 as possible in the first embodiment when no potential difference is applied between the first and second electrodes 50, 60. Any mismatch between the strain inducing layer 30 and the piezomagnetic layer 20 may result in a strain in the piezomagnetic layer 20 when zero potential difference is applied between the first and second electrodes 50, 60. As long as any magnetisation in the piezomagnetic layer 20 at zero potential difference is present between the first and second electrodes 50, 60 results in a magnetic field in the storage layer 10 which is lower than the coercive field of the storage layer 10, that is acceptable.

The lattice constant of the strain inducing layer 30 and piezomagnetic layer 20 (and between other layers) can be adjusted by changing the growth conditions and composition (as described below). In this way, the lattice mismatch between the various layers can be adjusted. Desirably the lattice mismatch between the storage layer 10 and the piezomagnetic layer 20 and/or between the piezomagnetic layer 20 and the strain inducing layer 30 and/or between the first or second electrode 50/60 and its adjacent layer is less than 1%, more desirably less than 0.5%. This not only results in a long lasting device and other desirable properties as described elsewhere, but also means that it is possible to develop a two- or even three-dimensional array of memory cells extending laterally and vertically which has a high degree of robustness.

The operation of the first embodiment of the present invention will now be described in detail with reference to FIG. 6. The embodiment of FIG. 6 uses the principle illustrated in FIG. 2. That is, in order to write data to the storage layer 10, a potential difference is applied between the first and second electrodes 50, 60 in a certain direction in order to contract or expand the strain inducing layer 30 and thereby to apply a compressive or tensile strain in the piezomagnetic layer 20. As a strain is induced in the piezomagnetic layer 20, a magnetisation will develop in the piezomagnetic layer 20 in a direction according to whether the strain is tensile or compressive. Through dipolar coupling between the piezomagnetic layer 20 and the storage layer 10, the spontaneous magnetisation of the storage layer 10 will be switched according to the direction of magnetisation of the piezomagnetic layer 20 in the first type of effect. In this way, the direction of magnetisation in the storage layer 10 can be changed by applying a positive or negative potential difference between the first and second electrodes 50, 60.

When the potential difference between the first and second electrodes 50, 60 is removed, the strain inducing layer 30 returns to its original shape and the strain in the piezomagnetic layer 20 also returns to its original level (close to zero, particularly if there is low lattice mismatch between the piezomagnetic layer 20 and the strain inducing layer 30). As a result, no magnetisation remains in the piezomagnetic layer once the potential difference between the first and second electrodes 50, 60 has been removed.

With negligible magnetisation in the piezomagnetic layer 20, and assuming that there is no exchange bias effect between the piezomagnetic layer 20 and the storage layer 10, the magnetisation of the storage layer 10 remains fixed by the magnetic anisotropy (coercive field) of the ferromagnetic storage layer (assuming no external magnetic field) and this is the second type of effect.

In an embodiment, in order to avoid exchange bias between the piezomagnetic layer 20 and the storage layer 10, a (metallic) non-magnetic layer 15 may be provided between the storage layer 10 and the piezomagnetic layer 20. The non-magnetic layer 15 may be relatively thin (of the order of a nanometre). For such a thin layer, the lattice constant of the material will match that of the adjacent layers (the piezomagnetic layer 20 and the storage layer 10) such that no strain will be induced by the presence of the non-magnetic layer 15. The non-magnetic layer 15 prevents exchange bias between the storage layer 10 and the piezomagnetic layer 20. The prevention of exchange bias between those two layers means that when the magnetisation in the piezomagnetic layer 20 is removed, any magnetisation in the storage layer 10 is unaffected.

Even if a small magnetisation remains in the piezomagnetic layer 20 after the removal of the potential difference between the first and second electrodes 50, 60, so long as any magnetic field acting on the storage layer 10 resulting from the magnetisation of layer 20 is lower than the coercive field of the storage layer 10, no change in the magnetisation of the storage layer 10 will occur. Therefore, the first embodiment makes use of magnetic anisotropy (combination of magneto-crystalline and shape anisotropy) of the ferromagnetic material of the storage layer 10. The lateral dimensions of each memory bit are smaller than typical magnetic domain sizes so the storage layer 10 is assumed to be in a single domain state where the coercive fields are determined by the magnetic anisotropy.

In order to change the data (direction of magnetisation) stored in the storage layer 10, a potential difference opposite in direction to that previously applied is applied between the first and second electrodes 50, 60. This induces the opposite of a tensile or compressive strain in the strain inducing layer 30 and thereby in the piezomagnetic layer 20 and so a magnetisation opposite in direction develops. Thereby, via the dipolar coupling, the direction of magnetisation in the storage layer 10 is changed.

In the first embodiment, the preferred antiperovskite piezomagnetic material is $Mn_3SnN$ or $Mn_3SnN$ based as this material according to FIG. 2 exhibits the greatest change induced magnetic field with strain. The material can be optimised to have a desirable lattice parameter and piezomagnetic properties by changing its chemical composition, e.g., $Mn_{3-x}A_xSn_{1-y}B_yN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn. It could also be derived from other antiperovskite than $Mn_3SnN$. In general, it can be any material with piezomagnetism at room temperature and good lattice match with the other layers.

In an embodiment, the piezomagnetic layer 20 is in contact with a surface of the strain inducing layer 30. In an embodiment, the non-magnetic layer 15 is in contact with the piezomagnetic layer 20. In an embodiment, the storage layer 10 is in contact with the non-magnetic layer 15. In an embodiment, the first electrode 50 is in contact with the storage layer 10. In an embodiment, the second electrode 60 is in contact with the strain inducing layer 30.

In an embodiment, the storage layer 10 is a perovskite or antiperovskite material, for example $Co_3FeN$. The strain inducing layer 30 may be formed on an electrode which itself is formed on a substrate, for example a substrate of MgO, $SrTiO_3$, $Nb:SrTiO_3$ or Si. In an embodiment, the substrate has lattice parameters which match those the electrode and strain inducing layer 30. In an embodiment, the substrate (for example $Nb:SrTiO_3$ or doped Si) on which the layers are grown can be used as the electrode and a separate electrode is not needed.

The first electrode 50 can be made of a metal or a conducting perovskite such as Nb:SrTiO$_3$ or SrRuO$_3$. The second electrode 60 may be made of Nb:SrTiO$_3$ or SrRuO$_3$.

In order to read the data stored in the storage layer 10, use is made of the magneto-capacitance effect. A further property of antiperovskite piezomagnetic materials is that their stiffness changes as a result of the magnetic field present in them due to the magneto-elastic coupling. The presence of magnetisation in the storage layer 10 results in a magnetic field in the piezomagnetic layer 20 even at zero strain. The magnetic field in the piezomagnetic layer 20 results in a change in the elasticity of the piezomagnetic layer 20 compared to when no magnetic field is present in the piezomagnetic layer 20. The change in elasticity in the piezomagnetic layer 20 can be measured as a change in the magneto-capacitance of the capacitor formed by layers 20, 30, and 60. The change in magneto-capacitance is asymmetric, meaning that the measured capacity is different for the two opposite alignments of magnetisation in the storage layer 10. Thus, by measuring the magneto-capacitance of the capacitor formed by layers 20, 30, and 60 it is possible to determine the direction of magnetisation in the storage layer 10. Thereby by measuring the magneto-capacitance between the first and second electrodes 50, 60 the direction of the magnetisation in the storage layer 10 can be determined.

One way of measuring the magneto-capacitance between the first and second electrodes 50, 60 comprises applying an alternating voltage between the first and second electrodes 50, 60 and measuring the response (reactance). This is explained further below with reference to FIG. 10.

Thereby with only two electrodes it is possible to both write to the storage layer 10 and read from the storage layer 10 without the need for a transistor and without the need for a third or more electrodes. This is desirable as designs of two or three-dimensional memories comprising plural non-volatile memory cells of the present invention are possible which are particularly compact and simple in design.

A second embodiment will now be described with reference to FIG. 7. The second embodiment is the same as the first embodiment except as described below.

The second embodiment relies on the behaviour of the piezomagnetic layer 20 as illustrated in FIGS. 3-5. That is, the property of the piezomagnetic layer 20 is switched from antiferromagnetic behaviour (second type of effect) to paramagnetic behaviour (first type of effect) by inducing a strain in it (and thereby changing the Neel temperature to below the temperature experienced by the piezomagnetic layer 20). In the second embodiment, the non-magnetic layer 15 of the first embodiment is omitted. As a result, an exchange bias exists between the storage layer 10 and the piezomagnetic layer 20 when the piezomagnetic layer is antiferromagnetic (e.g. when no potential difference is applied between the first and second electrodes 50, 60).

When a potential difference is applied between the first and second electrodes 50, 60, the strain induced by the strain inducing layer 30 in the piezomagnetic layer 20 is effective to lower the Neel temperature of the piezomagnetic layer 20 such that the antiperovskite piezomagnetic layer 20 becomes paramagnetic. When the piezomagnetic layer 20 is paramagnetic, no exchange bias exists between the piezomagnetic layer 20 and the storage layer 10. However, when the piezomagnetic layer 20 is antiferromagnetic (e.g. after the potential difference is turned off), an exchange bias does exist between the piezomagnetic layer 20 and the storage layer 10. When an exchange bias exists between the piezomagnetic layer 20 and the storage layer 10, the direction of magnetisation of the storage layer 10 is fixed, even if a magnetic field greater in strength than the coercive field is present. Layer 20 can fix the magnetisation of layer 10 to at least two different directions depending on the magnetic state of layer 10 present when layer 20 turns antiferromagnetic.

The second embodiment thereby applies a potential difference between the first and second layers 50, 60 to induce a strain in the piezomagnetic layer 20 (through the strain inducing layer 30) to change the properties of the piezomagnetic layer 20 between canted antiferromagnetic and paramagnetic. Once the piezomagnetic layer 20 is paramagnetic, it is possible to change the direction of magnetisation in the storage layer 10. This can be achieved, for example using an external magnetic field. For this purpose, at least one additional electrode 70 inducing a magnetic field or a perpendicularly magnetised layer 70 can be provided, for example. Individual additional electrodes 70 can act globally over two or more memory cells, or locally to a single memory cell. Alternatively, an additional layer with constant magnetisation perpendicular to the magnetisation of the storage layer 10 is included to induce precessional switching of the magnetisation of the storage layer 10 when it becomes unpinned for one half of its precession period. This further mechanism is advantageous in the embodiment where the piezomagnetic material 20 is made paramagnetic in a write procedure in order to unpin the storage layer 10. By inducing a magnetic field in the storage layer 10 using the electrode 70, the direction of magnetisation of the storage layer 10 can be changed. After the direction of magnetisation in the storage layer 10 has been changed, thereby to write data to the storage layer 10, the potential difference applied across the first and second electrodes 50, 60 is removed. Thereby the Neel temperature of the piezomagnetic layer 20 is raised above the ambient temperature so that the piezomagnetic layer 20 acts as an antiferromagnet. When the piezomagnetic layer 20 acts as an antiferromagnet, the direction of magnetisation (in this case magnetic spin polarisation) of the storage layer 10 is fixed due to the exchange bias interaction between the piezomagnetic layer 20 and the storage layer 10. Thereby even if the magnetisation electrode 70 is used to write information to an adjacent non-volatile memory cell and the magnetic field extends into the storage layer 10 of the memory cell under consideration, the direction of magnetisation of the storage layer 10 of the memory cell under consideration will not be changed.

In the second embodiment, the data is read from the non-volatile memory cell in the same way as the first embodiment by using the magneto-capacitance effect. However in this case the direction of magnetisation in the storage layer is reversed by applying a strain below TN to layer 20 and then after storage layer 10 is reversed, apply a fast strain pulse to turn piezomagnetic layer 20 paramagnetic and thereby reset the pinning direction without changing the new magnetisation direction of storage layer 10.

In the second embodiment, the most preferred antiperovskite piezomagnetic material is Mn$_3$GaN or Mn$_3$NiN, or Mn$_3$GaN or Mn$_3$NiN based materials such as e.g. Mn$_{3-x}$A$_x$Ga$_{1-y}$B$_y$N$_{1-z}$ or Mn$_{3-x}$A$_x$Ni$_{1-y}$B$_y$N$_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn, as these materials have a Neel temperature at zero strain roughly equal to the ambient temperature and the temperature at which the memory operates. Preferably the piezomagnetic material has a Neel temperature which varies with strain and wherein the Neel temperature passes 293 k when the strain is varied from +30% to −30%, preferably +10% to −10%, most preferably +1% to −1%. If such a material is used it is not necessary to heat or to cool the non-volatile memory cell as the change in Neel temperature can be effected at ambient temperature.

A third embodiment will now be described with reference to FIG. 8. The third embodiment is the same as the first and second embodiments except as described below. In the third embodiment, the non-volatile memory cell comprises exactly the same layers as the cell of the second embodiment except layers 10 and 70 which are not needed. The information is stored in the ferroelectric layer 30 instead.

In the third embodiment, the storage layer is a ferroelectric layer 30 (as in the first and second embodiment but the additional piezoelectric property is now not required) in which data is recordable as a direction of electric polarisation. Data can be written to the non-volatile electric memory cell by applying a potential difference between the first and second electrodes 50, 60. This can switch an electric polarisation in the ferroelectric layer 30, depending on the polarity of the applied potential difference. Electric polarisation will remain even once the potential difference between the first and second electrodes 50, 60 is removed due to electric hysteresis of the ferroelectric material.

The electric polarisation in the ferroelectric layer 30 induces a magnetic moment in the piezomagnetic layer 20. This magnetic moment results in a change in the magneto-capacitance of the capacitor formed by layers 20, 30, and 60 which can be measured in the same way as in the first and second embodiments. As in the first and second embodiments the determined magneto-capacitance can be related to the direction of polarisation (electric in the case of the third embodiment). Thereby, the data stored in the storage layer 30 can be read.

The reading and writing of memory bits in an N-by-N array with the cross-bar geometry can be accomplished non-destructively and without a transistor at each bit following the same steps as in case of the first and second embodiments as described below with reference to FIGS. 9-12.

All of the embodiments resist structural fatigue and are orders of magnitude better in this regard than typical flash memory. The first and second embodiments are even more resistance to structural fatigue than the third embodiment.

In the third embodiment, the ferroelectric layer 30 may be in contact with the piezomagnetic layer 20. In an embodiment the ferroelectric layer 30 is formed of perovskite ferroelectric material (for example $PbTiO_3$, $SrTiO_3$, $BaTiO_3$, $Ba_xSr_{1-x}TiO_3$, $Ba(Zr_xTi_{1-x})TiO_3$). The piezomagnetic layer 20 may be formed of any Mn-based antiperovskite material such as $Mn_3SnN$, $Mn_3GaN$ or $Mn_3NiN$, or $Mn_3SnN$, $Mn_3GaN$ or $Mn_3NiN$ based materials, as described above.

The non-volatile memory cells of the present invention have the advantage of easily being incorporated into two or three-dimensional arrays.

FIG. 9 is a perspective schematic view of a two-dimensional array of magnetic memory cells according to an embodiment. As can be seen, a plurality of non-volatile memory cells according to the first or second embodiment are placed in a two-dimensional array. The first and second electrodes 50, 60 are in the form of strips. A plurality of first and second electrodes extend in orthogonal directions and each electrode is connected to a plurality of memory cells extending along the length of the electrode 50, 60. Each memory cell is thereby individually addressable by applying a potential difference between electrodes 50 extending in a first direction and second electrodes 60 extending in the orthogonal direction as described above for each embodiment (FIGS. 10 and 11 show details of the potential difference applied in the first & third embodiments and the second embodiment, respectively). In this way, a densely packed two-dimensional non-volatile memory can be assembled in which individual memory cells are individually addressable and in which no transistors are needed for reading or writing data to the individual memory cells.

Figure 10:
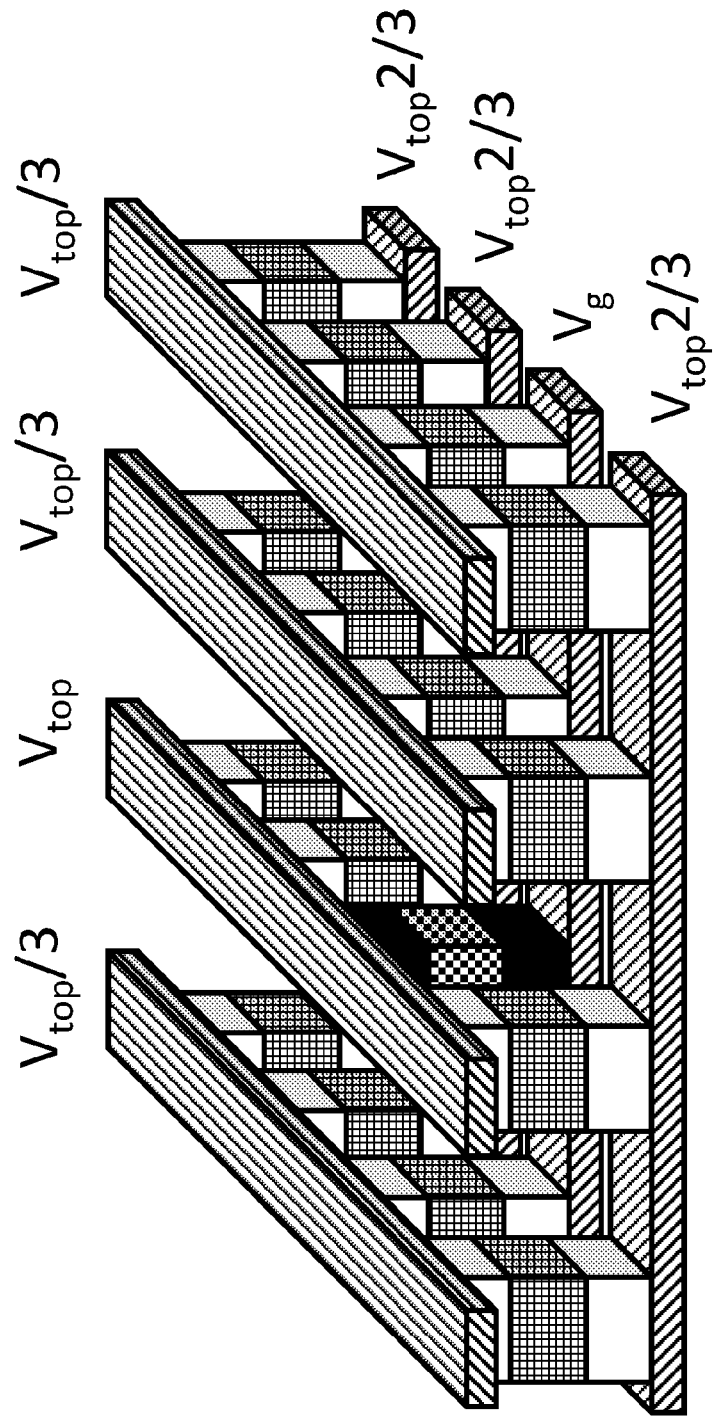
FIG. 10 is an explanation of writing to a two-dimensional memory array of the first embodiment (and is also applicable to a two-dimensional memory array of the third embodiment)

As explained above, in the first embodiment, magnetisation of the storage layer 10 remains locked by the coercive field parallel (state 1) or antiparallel (state 0) to the small magnetisation of the piezomagnetic layer 20. Each alignment state leads to a different magnetic state of the piezomagnetic layer 20 and thereby to different elastic properties which are detectable by magneto-capacitance measurement. This writing mechanism allows for addressing of individual bits integrated in an N-by-N array where each bit is connected to one of N top leads and to one of N bottom leads. The top and bottom set of leads are perpendicular to each other (cross-bar geometry), as illustrated in FIG. 9. FIG. 10 shows how to write the state of a memory bit of a memory cell according to the first embodiment (the same principles apply to the third embodiment, but with the different layered structure). DC-electric potentials $V_{top}$ and $V_g$ are applied to the top and bottom leads contacting the memory cell of interest, respectively. A smaller DC-potential (e.g. $V_{top}/3$) is applied to the rest of the top leads and e.g. $2*V_{top}/3$ is applied to the rest of the bottom leads. This results in a large voltage ($V_{top}$, where $V_g=0$ is the ground) at the memory bit of interest which induces a strain in the piezomagnetic layer 20 which in turn induces a magnetisation which is large enough to overcome the coercive field of the storage layer 10 and switch its magnetisation. All the other individual memory cells of the array are subject to a voltage which is only a third ($2*V_{top}/3-V_{top}/3=V_{top}/3$) of the switching voltage ($V_{top}$) so their state is not affected (a voltage below a threshold set by the coercive field).

Figure 12:
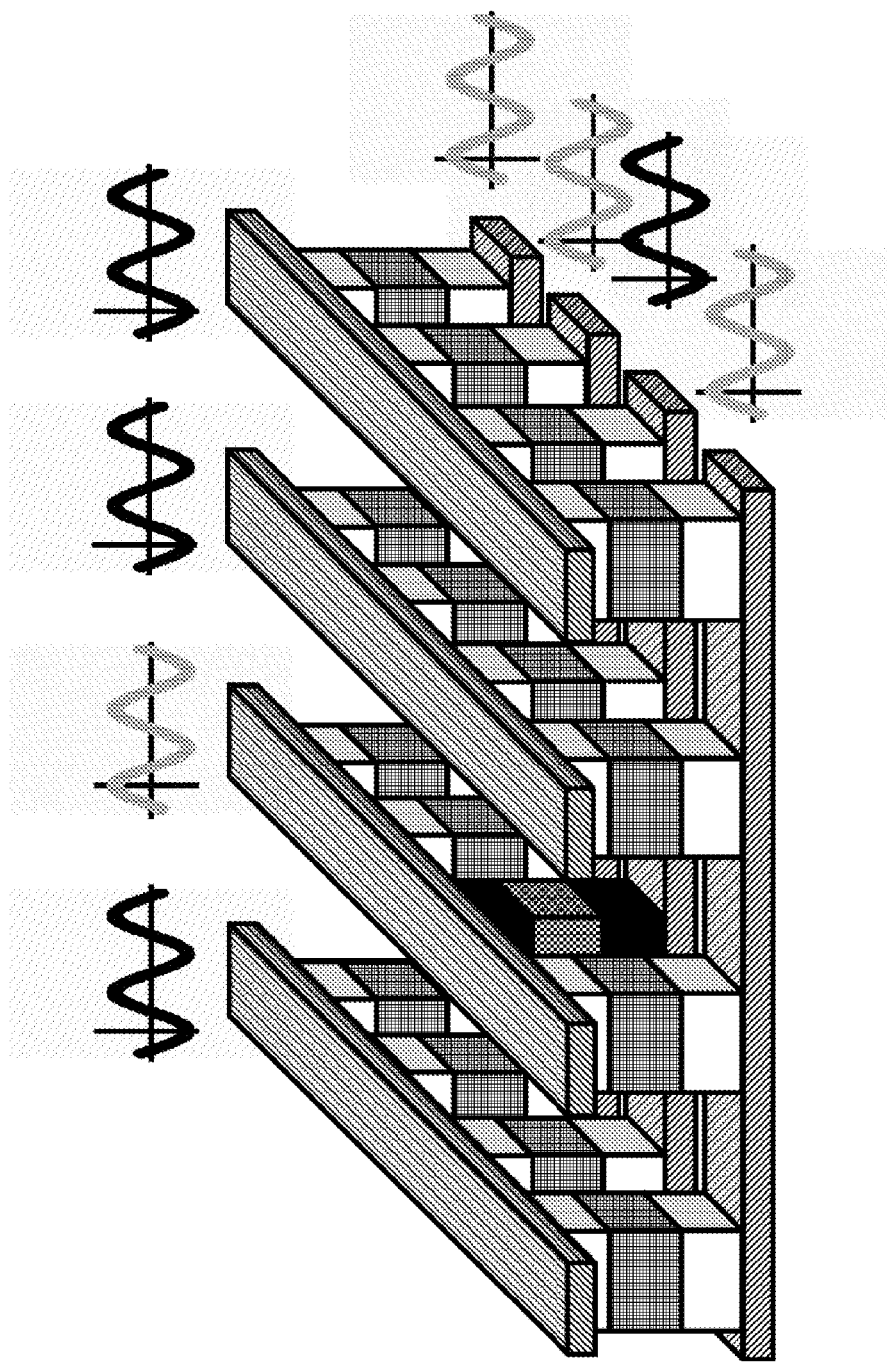
FIG. 12 is an explanation of reading of a two-dimensional memory array of all three embodiments.

In order to read information, as illustrated in FIG. 12, a small AC-voltage is applied to the plates of the capacitor (piezomagnetic layer 20 and the bottom contact layer 60) which is not large enough to induce a strain that could alter the magnetic state of the storage layer 10 but allows for a measurement of reactance and thereby of the capacity of the memory bit. The capacity depends on the relative permittivity and dimensions of the insulating strain-inducing layer 30, which in turn depends on the elastic properties of the piezomagnetic layer 20, which depend on the alignment of the magnetisation in the storage layer 10 (or 30 in scenario 3). This reading mechanism allows for addressing of individual bits integrated in the N-by-N array described above. To read a memory bit, an AC-voltage is applied to the top and bottom leads contacting the relevant memory bit and an AC-voltage with opposite phase is applied to all leads not contacting the relevant memory bit. Thereby, at any point in time the voltage at any bit connected to the same leads as the relevant memory bit is zero and the voltage at any other bit is of the same size but opposite polarity as the voltage at the memory bit of interest. Therefore, the capacity of the memory bit of interest can be read without being affected by signal from other bits connected to the same leads and without affecting the memory state of any bit (non-destructive readout).

Alternatively, the difference of magneto-capacitance between the two magnetic states of the piezomagnetic layer can be determined as a shift of a resonance frequency of a circuit where the single memory cell is the capacitor and the inductor is in a control unit external to the memory array.

Figure 11:
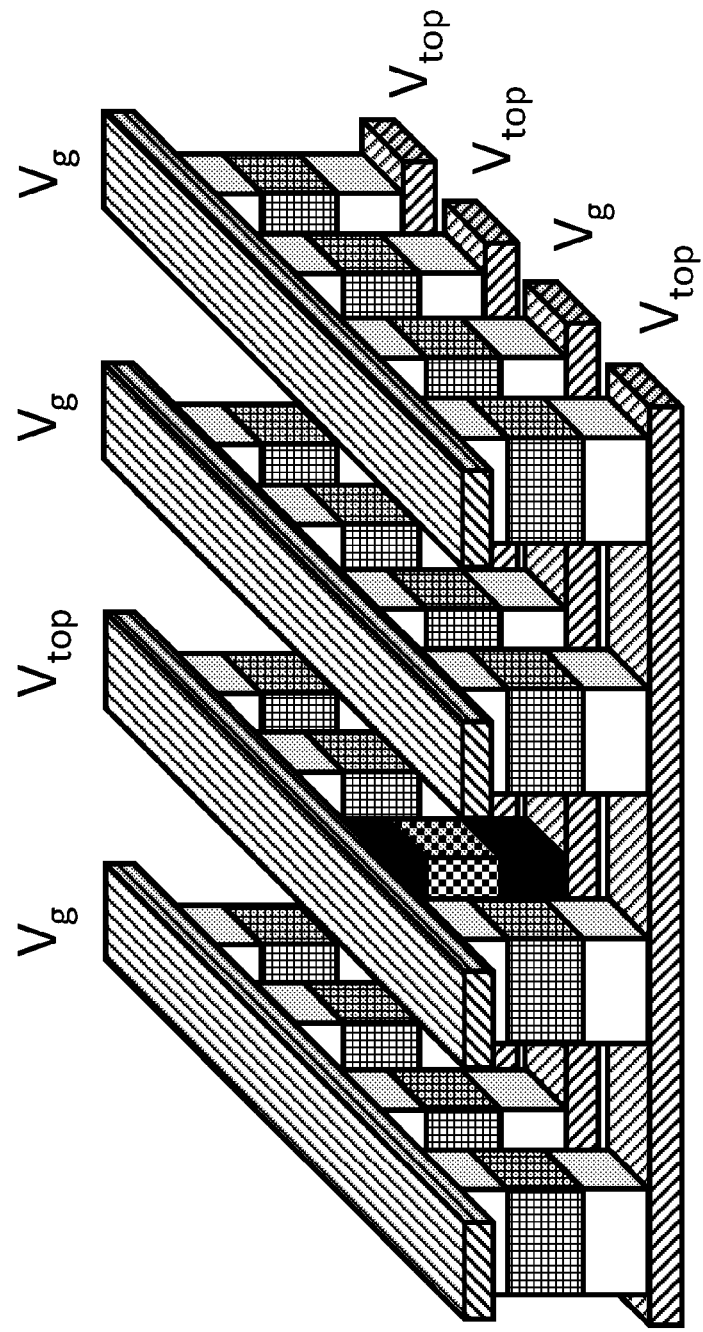
FIG. 11 is an explanation of writing a two-dimensional array of the second embodiment.

To write the state of a particular memory bit of the second embodiment in an N-by-N array with cross-bar geometry described above, DC-electrical potentials $V_{top}$ and $V_g$ are applied to the top and bottom leads contacting the particular memory bit, respectively as illustrated in FIG. 11. An opposite voltage is applied to all leads not contacting the particular memory bit ($V_{top}$ to the bottom leads and $V_g$ to the top leads). This results in a large voltage ($V_{top}-V_g$) at the particular memory bit which induces a strain in the piezomagnetic layer 20 which turns that layer paramagnetic so the particular memory bit is writable by an external magnetic field (not illustrated in FIG. 11). All the other memory bits of the array are subject to zero voltage or the same voltage with opposite polarity ($V_g-V_{top}$) so their Neel temperature is even higher above the ambient temperature and the magnetisation of their storage layer is fixed.

The reading in the N-by-N array of the second embodiment is the same as in case of the first and third embodiment described with reference to FIG. 12.

In the third embodiment, writing is accomplished by applying a DC voltage as in case of the first embodiment. However this time the voltage must be large enough to switch a ferroelectric polarisation of a selected bit between a first and second direction in the ferroelectric layer 30 thereby to write data to the memory cell, the ferroelectric polarisation of the ferroelectric layer 30 in the first direction induces a first magnetic state in the antiperovskite piezomagnetic layer 20 and the ferroelectric polarisation of the ferroelectric layer 30 in the second direction induces a second magnetic state in the antiperovskite piezomagnetic layer 20; the voltage applied to the rest of the bits is not sufficient to switch their electric polarisation; the voltage is then removed which does not affect the ferroelectric polarisation. The read method comprises the steps of: an AC voltage is applied to the 2D memory array as in the first type of embodiment as illustrated in FIG. 12 to measure a magneto-capacitance of the selected memory cell, the voltage applied at any point in time to the rest of the cells connected to the same leads is zero. The magneto-capacitance of the selected memory bit is different in the first magnetic state than in the second magnetic state of the piezomagnetic layer, thereby allowing to read the data stored in the storage layer.

Figure 13:
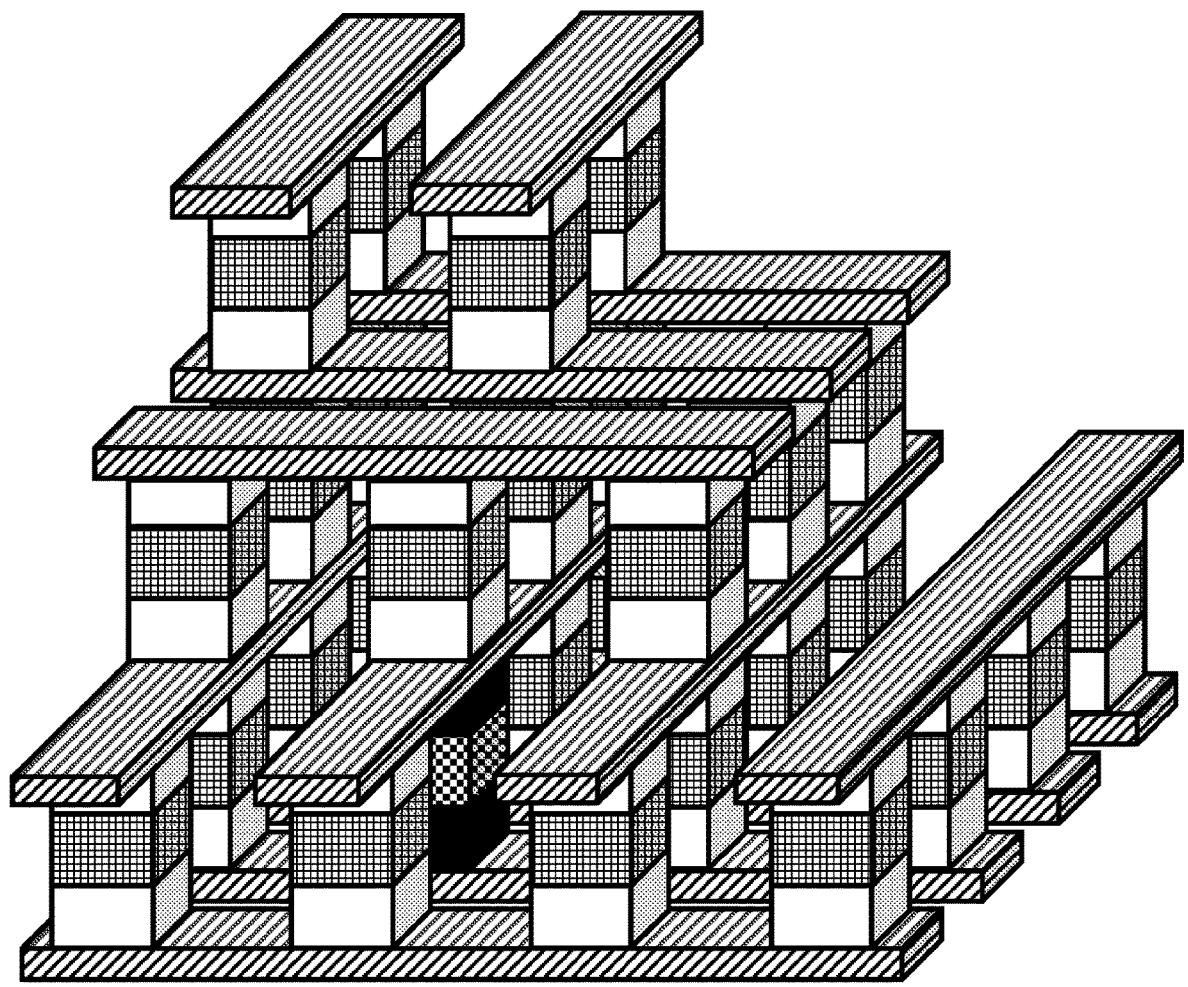
FIG. 13 is a perspective schematic view of a three-dimensional magnetic memory array according to an embodiment.

For all embodiments, because of the low lattice mismatch between individual layers, it is possible to build a three-dimensional memory array using similar principles in which electrodes between layers of memory cells are used to address memory cells on both sides of that electrode. In order to be able to reach the electrodes passing in the x-y direction, the width of the layers in the x and y directions decreases with height. Such a memory is illustrated schematically in FIG. 13.

Other arrangements of two and three-dimensional arrays are possible and within the scope of the skilled person.

The multilayers of this device can be manufactured using any thin film deposition method, optimised for the required layers. For example, a pulsed laser deposition (PLD) can be used. Example growth conditions for each thin film follow below.

Step 1: Substrate selection and cleaning.

Any suitable oxide substrate (e.g. MgO, SrTiO$_3$, Nb:SrTiO$_3$, (LaAlO$_3$)$_{0.3}$(Sr$_2$TaAlO$_6$)$_{0.7}$) or Si can be used as the substrate. The substrate is cleaned with a standard solvent clean procedure prior to the growth. The standard solvent clean procedure which may be a three-minute clean in an ultrasonic bath with Acetone, then Isopropanol and finally Distilled Water, with a N$_2$ blow dry after each solvent step. In an embodiment, the substrate may become the bottom electrode 60.

Step 2: Multilayer Growth (PLD and Magnetron Sputtering).

Thin films are deposited by PLD using a KrF excimer laser ($\lambda$=248 nm). Stoichiometric single phase targets of SrRuO$_3$, Nb:SrTiO$_3$, BaTiO$_3$, Ba$_x$Sr$_{1-x}$TiO$_3$, BaZr$_x$Ti$_{1-x}$O$_3$, Mn$_3$SnN and Mn$_3$GaN respectively, are ablated by a laser with fluency of 0.8 J/cm$^2$ at 10 Hz.

Layer 1—Second Electrode 60-100 nm SrRuO$_3$ thin film is grown at 700° C.-780° C. under an O$_2$ partial pressure of 50-300 mTorr. After deposition, the grown film is subsequently in-situ post-annealed for 20 minutes at the growth temperature under an O$_2$ partial pressure of 600 Torr. Then, the sample is cooled down to room temperature at 10° C./min under an O$_2$ partial pressure of 600 Torr.

Or 100 nm Nb:SrTiO$_3$ thin film, grown at 700° C. under an O$_2$ partial pressure of 0-60 mTorr. After growth, the sample is cooled down to room temperature at 10° C./min under an O$_2$ partial pressure of 600 Torr.

Layer 2—Piezoelectric material of strain inducing layer 30—100 nm BaTiO$_3$ (Ba$_x$Sr$_{1-x}$TiO$_3$ or BaZr$_x$Ti$_{1-x}$O$_3$) thin film is grown at 750° C.-800° C. under an O$_2$ partial pressure of 150-300 mTorr. After growth, the sample is cooled down to room temperature at 10° C./min under an O$_2$ partial pressure of 600 Torr.

Layer 3—Piezomagnetic layer 20 of Mn$_3$XN, where X is any suitable element—for example, 100 nm Mn$_3$SnN thin film is grown at 300° C.-550° C. under a N$_2$ partial pressure of 0-12 mTorr. After growth, the sample is cooled down to room temperature at 10° C./min under a N$_2$ partial pressure of 0-12 mTorr.

Or 100 nm Mn$_3$GaN grown at 300° C.-550° C. under a N$_2$ partial pressure of 0-12 mTorr. After growth, the sample is cooled down to room temperature at 10° C./min under the N$_2$ partial pressure of 0-12 mTorr.

Spacer Layer (only for embodiment 1)—Perovskite paramagnet of non-magnetic layer 15—a 1~2 nm Platinum (Pt) thin film is grown on a sample (comprised of the substrate, layers 60, 30, and 20) by DC magnetron sputtering. The sample is heated to 800° C. in ultra-high vacuum and annealed for 1 hour. Pt thin film is deposited at 100 W DC power. After growth, the sample is cooled down to room temperature at 10° C./min under vacuum.

Layer 4—Ferromagnetic material of storage layer 10—20-50 nm Co$_3$FeN thin film is grown at 300° C.-500° C. by RF magnetron sputtering from a Co$_3$Fe target in 5-20 mTorr Ar+N$_2$ gas mixture atmosphere in which the volume concentration of N$_2$ gas is in a range of 5-15%. After growth, the sample is cooled down to room temperature at 10° C./min.

Layer 5—First Electrode 50-100 nm of a metal (for example Pt, Au) or a conductive perovskite thin film (for example SrRuO$_3$, Nb:SrTiO$_3$).

100 nm Pt thin film is grown by DC magnetron sputtering. The sample is heated to 800° C. in ultra-high vacuum and annealed for 1 hour. Pt thin film is deposited at 100 W DC power. After growth, the sample is cooled down to room temperature at 10° C./min under vacuum.

Or 100 nm SrRuO$_3$ thin film is grown at 700° C.-780° C. under an O$_2$ partial pressure of 50-300 mTorr. After deposition, the grown film is subsequently in-situ post-annealed for 20 minutes at the growth temperature under an O$_2$ partial pressure of 600 Torr. Then, the sample is cooled down to room temperature at 10° C./min under the O$_2$ partial pressure of 600 Torr.

Or 100 nm Nb:SrTiO$_3$ thin film, grown at 700° C. under an O$_2$ partial pressure of 0-60 mTorr. After growth, the sample is cooled down to room temperature at 10° C./min under an O$_2$ partial pressure of 600 Torr.

Step 3: Photolithography.

A standard photolithography process has been implemented to apply an array pattern. For 2D devices, all layers can be deposited and then patterned. For 3D stacking device, each memory cell layer has to be patterned before the next layer is deposited.

Step 4: Etching.

A standard Argon Ion Milling process to remove material and transfer the pattern from photolithography onto the sample, or any other suitable chemical or physical etching technique is implemented.

The invention claimed is:

1. A non-volatile memory cell comprising:
   a storage layer comprised of a ferromagnetic material in which data is recordable as a direction of magnetisation;
   a piezomagnetic layer comprised of an antiperovskite piezomagnetic material selectively having a first type of effect on the storage layer and a second type of effect on the storage layer dependent upon a strain in the piezomagnetic layer; and
   a strain inducing layer for inducing a strain in the piezomagnetic layer thereby to switch from the first type of effect to the second type of effect.

2. The non-volatile memory cell of claim 1, wherein the first type of effect is one where a net magnetisation of the piezomagnetic layer is strong enough to overcome the coercive field in the storage layer and for the magnetisation of the storage layer to align with the magnetisation of the piezomagnetic layer through dipolar coupling and the second type of effect is one where any magnetic field in the storage layer due to any magnetisation in the piezomagnetic layer is lower than the coercive field of the storage layer.

3. The non-volatile memory cell of claim 1, further comprising a non-magnetic layer between the storage layer and the piezomagnetic layer for preventing an exchange bias between the storage layer and the piezomagnetic layer.

4. The non-volatile memory cell of claim 1, wherein the antiperovskite material has a Neel temperature greater than 350K at a strain of +/−30%, preferably +/−10%, most preferably +/−1%.

5. The non-volatile memory cell of claim 1, wherein the antiperovskite piezomagnetic material is Mn3SnN or Mn3SnN based such as Mn3-xAxSn1-yByN1-z, where A and B are one or more elements selected from the list including: Ag, Al, Au, Co, Cu, Fe, Ga, Ge, In, Ir, Ni, Pd, Pt, Rh, Sb, Si, Sn, Zn.

6. The non-volatile memory cell of claim 1, wherein the first type of effect is one in which the piezomagnetic layer is in the paramagnetic state and no exchange bias interaction between the storage layer and the piezomagnetic layer is present thereby allowing the direction of magnetisation of the storage layer to be changed by an external magnetic field and the second type of effect is an exchange bias interaction in which the piezomagnetic material is in the antiferroinagnetic state and the direction of magnetisation of the storage layer is pinned by the pi ezomagnetic layer.

7. The non-volatile memory cell of claim 6, wherein the antiperovskite piezomagnetic material has a Neel temperature which varies with strain and wherein the Neel temperature passes 293K when the strain is varied from +30% to −30%, preferably +10% to −10%, most preferably +1% to −1%.

8. The non-volatile memory cell of claim 6, wherein the antiperovskite piezomagnetic material is Mn3GaN or Mn3NiN, or Mn3GaN or Mn3NiN based such as Mn3-xAxGa1-yByN1-z or Mn3-xAxNi1-yByN1-z, where A and B are one or more elements selected from the list including: Ag, Al, Au, Co, Cu, Fe, Ga, Ge, In, Ir, Ni, Pd, Pt, Rh, Sb, Si, Sn, Zn.

9. The non-volatile memory cell of claim 6, further comprising at least one additional electrode to apply a magnetic field positioned adjacent the storage layer for changing the direction of a magnetisation of the storage layer.

10. The non-volatile memory cell of claim 1, wherein the strain inducing layer is a perovskite material.

11. The non-volatile memory of claim 1, wherein a lattice mismatch between the storage layer and the piezomagnetic layer and/or between the piezomagnetic layer and the strain inducing layer is less than 1%.

12. The non-volatile memory of claim 1, wherein the ferromagnetic layer has a perovskite or antiperovskite structure.

13. The non-volatile memory cell of claim 1, further comprising:
   a first electrode connected to the storage layer on a side opposite the piezomagnetic layer.

14. The non-volatile memory cell of claim 13, Wherein a lattice mismatch between the electrode and its adjacent layer is 1% or less.

15. The non-volatile memory cell of claim 1, further comprising:
   a second electrode connected to the strain inducing layer on a side opposite the piezomagnetic layer.

16. A two-dimensional array of memory cells comprising a plurality of the non-volatile memory cells of claim 1 in a two-dimensional array.

17. A three-dimensional array of memory cells comprising a plurality of the non-volatile memory cells of claim 1 in a three-dimensional array.

18. The non-volatile memory cell of claim 1, wherein the strain inducing layer is a piezoelectric layer.

19. The non-volatile memory cell of claim 1, wherein the storage layer is comprised of a ferromagnetic material in which data is recordable as two directions of magnetization which are opposite in direction.

20. A method of writing data to and reading data from a non-volatile memory cell, the method comprising the steps of:
   providing the non-volatile memory cell, the non-volatile memory cell comprising:
      a storage layer comprised of a ferromagnetic material in which data is recordable as a direction of magnetisation;
      a piezomagnetic layer comprised of an antiperovskite piezomagnetic material selectively having a first type of effect on the storage layer and a second type of effect on the storage layer dependent upon a strain in the pi ezomagnetic layer; and
      a strain inducing layer for inducing a strain in the piezomagnetic layer thereby to switch from the first type of effect to the second type of effect;
   inducing a polarisation in a first or second direction in the storage layer thereby to write data to the non-volatile memory cell, polarisation of the storage layer the first direction inducing a first magnetic state in the antiperovskite piezomagnetic layer and polarisation of the storage layer in the second direction inducing a second magnetic state in the antiperovskite piezomagnetic layer; and measuring a magneto-capacitance of the non-volatile memory cell, the magneto-capacitance of the antiperovskite piezomagnetic layer being different in the first magnetic state than in the second magnetic state, thereby to read the data stored in the storage layer.

21. The method of claim 20, wherein the measuring comprises applying an alternating voltage across the storage layer and antiperovskite layer and determining a reactance and thereby the magneto-capacitance of the memory cell.

22. The method of claim 20, wherein the measuring comprises determining a shift in resonance frequency of the memory cell.

23. The method of claim 20, wherein the polarisation of the storage layer is a magnetic polarisation.

24. The method of claim 23, wherein the inducing is performed by inducing a magnetisation in the antiperovskite piezomagnetic layer strong enough for the magnetic polarisation of the storage layer to align with the magnetisation of the antiperovskite piezomagnetic layer through dipolar coupling.

25. The method of claim 24, wherein the inducing the magnetisation in the antiperovskite piezomagnetic layer is achieved by inducing a strain in the antiperovskite piezomagnetic layer using the strain inducing layer.

26. The method of claim 23, wherein the inducing comprises inducing a magnetisation in the storage layer using a magnetisation electrode.

27. The method of claim 26, wherein the inducing further comprises inducing a strain in the antiperovskite piezomagnetic layer thereby to turn the antiperovskite piezomagnetic layer paramagnetic.

28. The method of claim 27, wherein the inducing the strain is accomplished by the strain inducing layer.

29. The method of claim 20, wherein the polarisation of the storage layer is an electric polarisation.

30. The method of claim 20, wherein the non-volatile memory cell comprises a first electrode connected to the antiperovskite piezomagnetic layer on a side opposite the storage layer and a second electrode connected to the storage layer on a side opposite the antiperovskite piezomagnetic layer, and the inducing comprises applying a potential difference across the first and second electrodes, and the measuring comprises measuring the magneto-capacitance between the first and second electrodes.

* * * * *